United States Patent [19]
Fiorina et al.

[11] Patent Number: 4,764,684
[45] Date of Patent: Aug. 16, 1988

[54] STATIC CONVERTER COMPRISING A PROTECTIVE FILTER AGAINST HIGH-FREQUENCY DISTURBANES

[75] Inventors: Jean-Noöl Fiorina, Grenoble; Hervé Denis, Echirolles, both of France

[73] Assignee: Merlin Gerin, France

[21] Appl. No.: 113,503

[22] Filed: Oct. 28, 1987

[30] Foreign Application Priority Data

Nov. 5, 1986 [FR] France ................................ 86 15620

[51] Int. Cl.$^4$ .............................................. H02J 9/00
[52] U.S. Cl. ........................................ 307/66; 174/51; 361/399; 363/39; 363/50
[58] Field of Search ...................... 307/66; 174/51; 361/414, 395, 399; 363/39, 40, 44, 50

[56] References Cited

U.S. PATENT DOCUMENTS

| | | | |
|---|---|---|---|
| 3,204,201 | 8/1965 | Bahrs ..................................... | 174/51 |
| 3,292,072 | 12/1966 | Hylten-Cavallius et al. ........ | 363/44 |

FOREIGN PATENT DOCUMENTS

23246  3/1978  Japan .................................... 363/39

OTHER PUBLICATIONS

Elektronik, vol. 33, No. 2, Jan. 1984, pp. 66–77.
Elektrotechnik, vol. 57, No. 8, 11 Apr. 1975, pp. 12–15.

*Primary Examiner*—William H. Beha, Jr,
*Attorney, Agent, or Firm*—Parkhurst & Oliff

[57] ABSTRACT

The protective filter comprises an internal reference plane, electrically insulated from the converter housing and acting as ground plane for the internal elements of the static converter, and filtering capacitors respectively connecting the internal reference plane to the input and output cables of the converter.

3 Claims, 2 Drawing Sheets

STATIC CONVERTER COMPRISING A PROTECTIVE FILTER AGAINST HIGH-FREQUENCY DISTURBANES

BACKGROUND OF THE INVENTION

The invention relates to a static converter comprising a filter protecting against high-frequency disturbances, the static converter comprising an external housing earthed by a protective conductor, input cables, connected respectively to the mains and to a battery bank, and an output cable connected to a user device.

The high-frequency disturbances due to switchings of the power semi-conductors, notably thyristors, in static converters can give rise to mains disturbances which have to be limited as far as possible.

To achieve this, insertion filters connected to the equipment frame are used in state-of-the-art devices. These filters are conventional low-pass LC filters, for example $\pi$-structured, inserted in line at the converter input and output, between the input or output cables and the converter frame, itself connected to the earth of the building in which it is installed.

As soon as the power of the converter reaches several tens of KVA, these filters require high-value capacitors to be used. The currents fed back via these capacitors to the protective conductor connecting the equipment frame to earth then very quickly exceed the permissible values. Indeed, these currents must remain limited to low values of a few milliamperes, in order not to cause spurious tripping of the insulation monitoring devices, in particular the differential circuit breakers located on the line side of the converter. With high-value capacitors, however, the currents, notably derived from the mains supply, which are fed back to the protective conductor are seen by the insulation monitoring devices as a permanent fault. Moreover, increasing the tripping threshold of these monitoring devices too much would result in real earth faults being masked and in the protection of persons in contact with this equipment being inacceptably reduced.

Furthermore, filtering the real common mode is very difficult to achieve with state-of-the-art in-line insertion devices and it is difficult to conciliate interference limiting requirements, i.e. a high-value inductance in the conventional LC filter, with the small dimensioning requirements due to the nominal current the inductance has to withstand.

SUMMARY OF THE INVENTION

The object of the invention is to achieve a static converter comprising a filter enabling the high-frequency disturbances fed back to the static converter input and output cables to be limited, notably in medium and high power static converters, and which does not present these drawbacks.

The static converter according to the invention is characterized in that the protective filter comprises an internal reference plane, electrically insulated from the housing and acting as a ground plane for all the internal converter elements, and filtering capacitors respectively connecting the input and output cables to said internal reference plane.

BRIEF DESCRIPTION OF THE DRAWINGS

Other advantages and features will become more clearly apparent from the following description of an illustrative embodiment of the invention, given as a non-restrictive example only and represented in the accompanying drawings, in which.

DESCRIPTION OF THE PREFERRED EMBODIMENT

Figure 1:
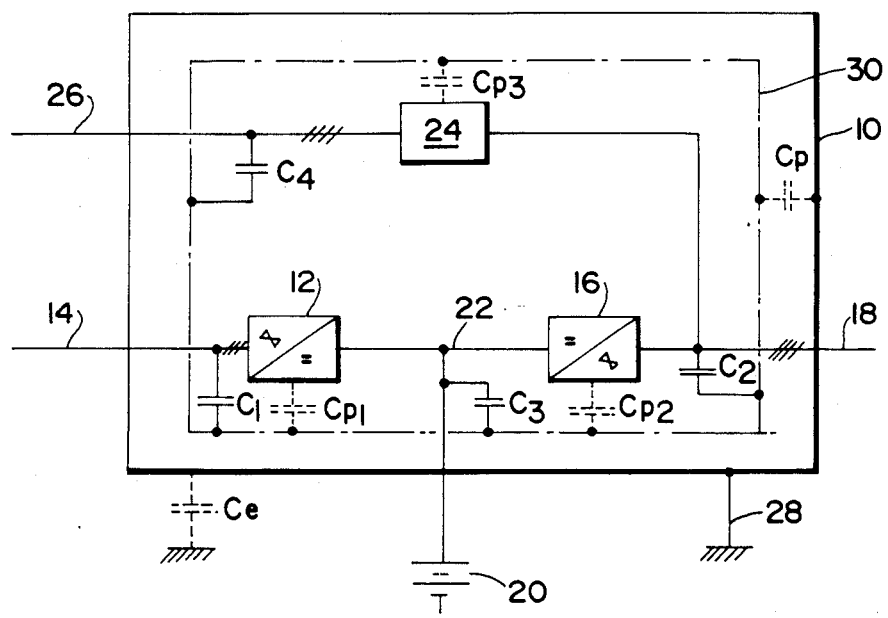
FIG. 1 represents, in schematic form, a static converter comprising a protective filter according to the invention.

The static converter represented in FIG. 1 comprises, in series in an external housing 10, a rectifier-charger 12 and an inverter 16. The rectifier-charger 12 is connected by a three-phase input cable 14 to the mains power supply and the inverter 16 is connected by a three-phase plus neutral output cable 18 to the user device. A battery bank 20 is connected to the cable 22 connecting the rectifier-charger 12 to the inverter 16. A branching circuit 24, connected by a three-phase plus neutral input cable 26 to a standby mains supply is also connected to the output cable 18. The external housing 10 of the converter is connected to the earth of the building by means of a protective conductor 28.

A static converter of this kind is well known in the art and it does not appear necessary to describe its structure or its operation in further detail here.

The converter filter according to the invention is made up of capacitors C1, C2, C3 and C4, respectively connecting the cables 14, 18, 22 and 26 to an internal reference plane which is not earthed and is consequently at a floating reference potential independent from the earth potential.

Stray capacities exist, however, between the various converter power components and the internal reference plane 30. In FIG. 1, dotted lines are used to represent the stray capacities CP1, CP2 and CP3 existing between the internal reference plane 30 and the rectifier-charger 12, the inverter 16 and the branching circuit 24 respectively, and the stray capacity CP existing between the internal reference plane and the external housing 10 and the stray capacity Ce existing between the housing 10 and the earth potential.

The disturbances due to switchings of the power semi-conductors of the circuits 12, 16 or 24 are therefore intercepted by the reference plane 30 by means of the filtering capacitors C1 to C4 and the stray capacities CP1 to CP3. The major part of the disturbances is therefore not retransmitted to the outside via the input and/or output cables, and as the reference plane 30 is not connected to the housing 10, the interference is not transmitted to the protective conductor 28 either.

The high-frequency currents, which are nevertheless fed back to the building earth via the stray capacities CP and Ce and which can consequently loop back via the protective conductor 28 to propagate the common mode, are very low, the internal reference plane 30 being at a virtual potential very close to earth in high frequency. The device thus achieved, which in addition does not involve any impedance unlike conventional insertion filters, therefore also provides a solution to filtering the real common mode.

In practice, the internal reference plane 30 is not achieved in the form of an internal shield as schematized in FIG. 1, but is made up of various interconnected elements. A particular embodiment of the various elements which can form the reference plane is illustrated in diagram form in FIG. 2.

Figure 2:
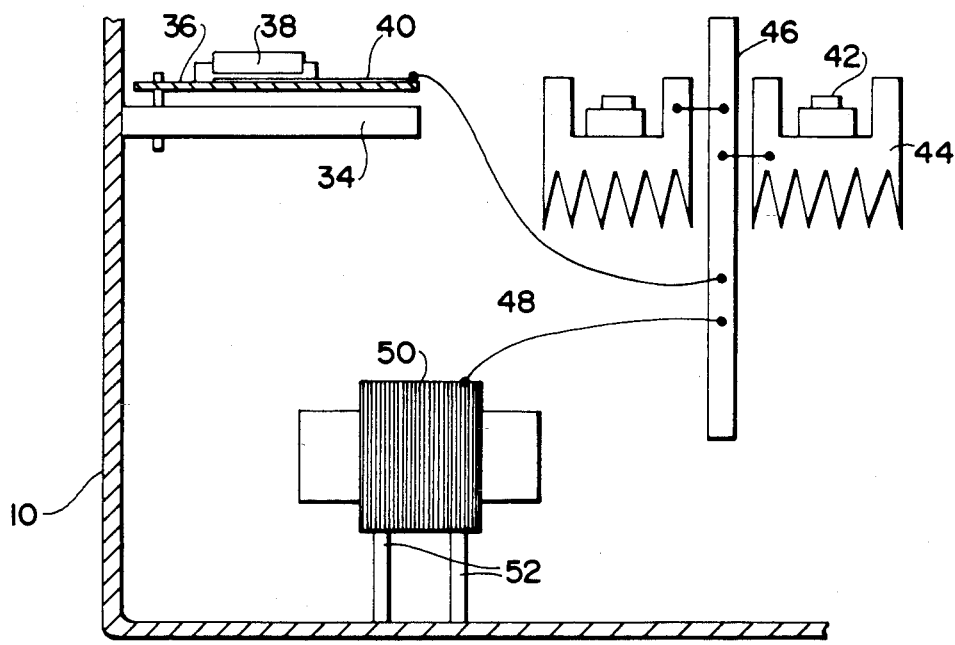
FIG. 2 represents, also in schematic form, a particular embodiment of an internal reference plane of a protective filter according to the invention.
Figure 3:
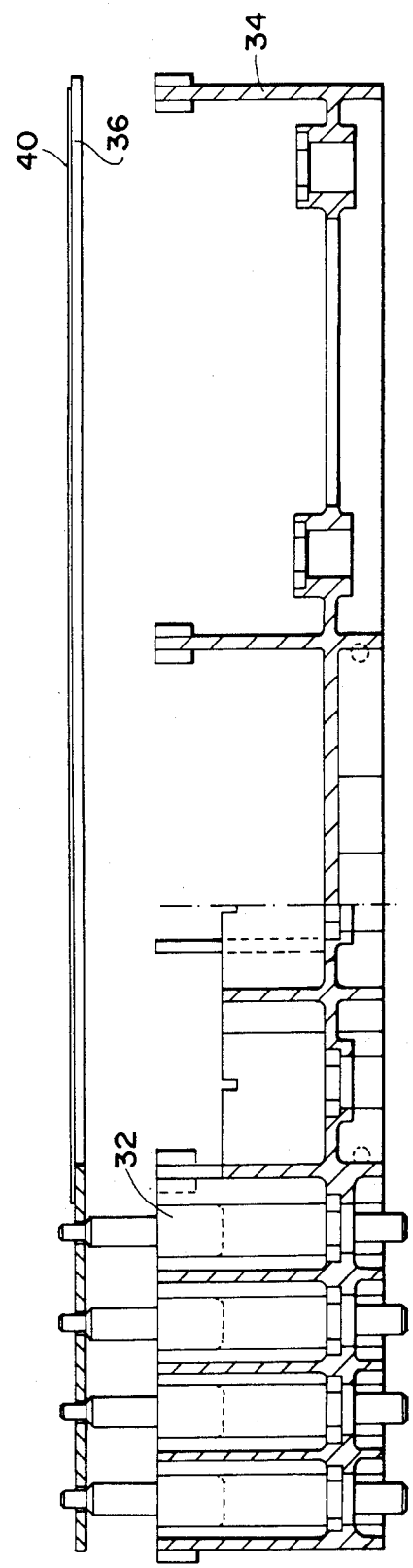
FIG. 3 represents in greater detail, in cross-section, the support of the converter input and output cable connection terminals to the protective filter according to the invention.

The input and output cables 14, 18, 22 and 26 are connected to the filtering capacitors C1 to C4, and to the various elements (12, 16, 24) which are respectively associated with them by means of connection terminals 32. As is shown in greater detail in FIG. 3, these connection terminals 32 are mounted in an insulating support 34 and support a printed circuit 36 carrying the filtering capacitors 38 (C1 to C4). The reference plane 30 is partly made up of a metallization 40 of as great a part as possible of one of the printed circuit faces. As is represented in FIG. 2, the semi-conductors 42 of the converter power components 12, 16 and 24, fitted in plastic casings with electrically insulated base-plates, are mounted on heat sinks 44 which are also connected to the printed circuit metallization acting as reference plane. This connection is preferably accomplished by means of a metal plate 46 disposed near the heat sinks and to which the latter are connected, the metal plate being itself connected by a conductor 48 to the printed circuit metallization 40 and forming in conjunction with the latter the internal reference plane 30.

Similarly, the magnetic circuits of the wound elements 50—transformers and inductance coils fixed by insulating elements 52 to the converter housing 10—are connected to the reference plane, preferably by means of the metal plate 46 or possibly by means of a second metal plate connected to the first one. The ground planes of the various internal elements of the converter are thus connected to the metallization 40 by means of at least one metal plate 46.

For high-power equipment, the semi-conductors, which are no longer in plastic casings with insulated base-plates, are not electrically insulated from the associated heat sinks. It is then no longer possible to connect the heat sinks directly to the reference plane. A metal shield placed as close as possible to the heat sinks without contact and connected to the reference plane is then used.

It is obvious that the filter according to the present invention can be used in any kind of static uninterruptible power supply.

What is claimed is:

1. A static converter comprising an external housing earthed by a protective conductor, input cables connected respectively to the mains and to a battery bank, an output cable connected to a user device, and a filter protecting against high-frequency disturbances comprising an internal reference plane, electrically insulated from the housing and acting as a ground plane for all the internal converter elements, and filtering capacitors respectively connecting the input and output cables to said internal reference plane.

2. The static converter according to claim 1, wherein the internal reference plane is made up on the one hand by a metallization of one face of a printed circuit bearing the filtering capacitors, and on the other hand by at least one metal plate connected to said metallization by a conductor and to which the ground planes of the various internal converter elements are connected.

3. The static converter according to claim 2, wherein said printed circuit is supported by connection terminals of the converter input and output cables, mounted in an insulating support disposed inside the housing.

* * * * *